United States Patent [19]

Nakamura et al.

[11] Patent Number: 5,736,901
[45] Date of Patent: Apr. 7, 1998

[54] RADIO FREQUENCY AMPLIFIER WITH STABLE OPERATION AND RESTRAINED OSCILLATION AT LOW FREQUENCIES

[75] Inventors: Morio Nakamura, Katano; Masahiro Maeda, Osaka; Yorito Ota, Kobe, all of Japan

[73] Assignee: Matsushita Electric Industrial Co., Ltd., Kadoma, Japan

[21] Appl. No.: 625,701

[22] Filed: Apr. 3, 1996

[30] Foreign Application Priority Data

Apr. 4, 1995 [JP] Japan ................................ 7-078726

[51] Int. Cl.⁶ ............................. H03F 3/60; H03F 3/16
[52] U.S. Cl. .................... 330/296; 330/286; 330/277
[58] Field of Search ......................... 330/277, 286, 330/302, 306, 296

[56] References Cited

U.S. PATENT DOCUMENTS

| 4,107,621 | 8/1978 | Furutani et al. | 330/296 |
| 5,229,732 | 7/1993 | Furutani et al. | 330/277 |
| 5,276,406 | 1/1994 | Samay et al. | 330/302 X |
| 5,406,224 | 4/1995 | Mikahi et al. | 330/277 |

FOREIGN PATENT DOCUMENTS

| 0015644 | 5/1979 | Japan | 330/296 |
| 56-2447 | 1/1981 | Japan . | |
| 3-270405 | 12/1991 | Japan | 330/296 |
| 404129308 | 4/1992 | Japan | 330/286 |

OTHER PUBLICATIONS

Maedaa et al, Institute of Electronics, Information and Communication Engineers of Japan, '93/11 vol. 176–C–I, No. 11, pp. 399–406, "Optimim Design of Low–Voltage and High Efficiency Gas Power Module", (no month).

*Primary Examiner*—Steven Mottola
*Attorney, Agent, or Firm*—Renner, Otto, Boisselle, Sklar

[57] ABSTRACT

In a radio frequency amplifier, a resistor and an inductor are connected to a gate terminal of transistor such as an FET. Another resistor for preventing oscillation is connected to the inductor. A capacitor and a third resistor connected to each other in parallel are connected to the first resistor while the other ends thereof are grounded. A resistance value of the resistor for preventing oscillation is in the range of about 30 $\Omega$ to about 70 $\Omega$. An inductance value of the inductor is such that an impedance value for a low frequency becomes negligibly small.

22 Claims, 9 Drawing Sheets

RADIO FREQUENCY AMPLIFIER WITH STABLE OPERATION AND RESTRAINED OSCILLATION AT LOW FREQUENCIES

BACKGROUND OF THE INVENTION

1. Field of the Invention

The present invention relates to a radio frequency (hereinafter, referred to as simply "RF") amplifier for obtaining RF power using a semiconductor device. In particular, the present invention relates to an RF power amplifier for supplying a high power output, which is mainly used for a transmitting circuit section of a communication apparatus and the like utilizing a microwave frequency band.

2. Description of the Related Art

Since various types of communication systems such as portable telephones are widely used these days, there is an increasing demand for an RF amplifier in a microwave frequency band. The RF amplifier is required to be designed so as to improve stability against oscillation. In particular, it is necessary to design a bias voltage supplying circuit included in the RF amplifier in view of restraint of oscillation since the bias voltage supplying circuit is electrically connected to an external circuit outside the RF amplifier.

Japanese Patent Publication No. 56-2447 discloses an example of a bias voltage supplying circuit of a conventional RF amplifier. FIG. 9A shows the configuration of a bias voltage supplying circuit 50 disclosed in the above-identified publication.

The bias voltage supplying circuit 50 is intended to supply a collector bias voltage of a field-effect transistor (hereinafter referred to as "FET"), and has the configuration in which two terminating circuits are connected in parallel to an RF blocking circuit $L_0$ which prevents adverse effects of the bias voltage supplying circuit in a frequency band of a signal to be amplified. More specifically, with the combination of one terminating circuit including a resistor $R_2$ and a coil $L_2$ connected in parallel and the other terminating circuit including a resistor $R_1$ and a capacitor $C_1$ connected in series, an unnecessary low-frequency signal can be terminated over a wide frequency band. Therefore, an unnecessary signal is not reflected, thereby preventing oscillation.

The conventional bias voltage supplying circuit 50 is actually used for supplying a collector bias voltage. Therefore, it is difficult to apply the bias voltage supplying circuit 50 to other types of the bias voltage supply circuits such as a gate bias voltage supplying circuit. It the bias voltage supplying circuit 50 is applied to the gate bias voltage supplying circuit, various problems arise, as described, because of the configuration of the bias voltage supplying circuit 50.

In the configuration of the bias voltage supplying circuit 50, the RF blocking circuit $L_0$ and the coil $L_2$ also serve for a bias voltage supplying line from a power source V. Therefore, in order to prevent an RF signal from being absorbed by the terminating circuits, it is necessary to form the RF blocking circuit $L_0$ as a long line (strip line) having a quarter wavelength with respect to an operating frequency, as shown in FIG. 9B representing an enlarged view of an encircled portion in FIG. 9A.

Moreover, since a portion of the signals, which have already been amplified by the FET, is removed in the configuration of the bias voltage supplying circuit 50, a sufficiently high efficiency is not obtained.

Furthermore, the resistor $R_1$ is provided in the conventional bias voltage supplying circuit 50 so as to improve the stability against oscillation, thereby terminating an unnecessary signal to eliminate the reflection thereof. In order to prevent an output power from being lowered, however, the resistor $R_1$ should be invisible at the operating frequency, which in turn requires the RF blocking circuit $L_0$ to have a sufficiently high impedance for a high frequency. More specifically, the RF blocking circuit $L_0$ formed of a microstrip line having an approximately quarter wavelength for the operating frequency, as described above. However, this configuration leads an increase in the area of a substrate occupied by the RF blocking circuit $L_0$. As a result, an area of the entire substrate is increased.

Since the RF blocking circuit $L_0$ actually has a sufficiently high impedance for a frequency slightly lower than the operating frequency, oscillation at a low frequency cannot be completely inhibited. When the impedance of the RF blocking circuit $L_0$ is lowered, the effect for restraining oscillation is improved. However, since a portion of the RF signals to be amplified is absorbed together with an unnecessary signal, an output power is lowered or impedance mismatching occurs, resulting in deterioration of the operational characteristics of the RF amplifier. Furthermore, since an unnecessary signal is removed from the amplified signals, the total conversion efficiency is adversely reduced.

As described above, restraining oscillation at a low frequency and maintaining excellent operational characteristics are in a trade-off relationship with each other and cannot be satisfied at the same time in a configuration of the conventional bias voltage supplying circuit 50. Thus, the operational efficiency obtained therefrom is not sufficiently high.

In addition, the RF power amplifier for use in a portable telephone or the like is required to have stability against load variation. However, when a load of the RF power amplifier is fluctuated (for example, an output load impedance is fluctuated from 50 $\Omega$) in the above-mentioned conventional bias voltage supplying circuit 50, oscillation may occur at a low frequency. In other words, the sufficient stability against load variation is not obtained with the configuration of the conventional bias voltage supplying circuit 50.

SUMMARY OF THE INVENTION

According to one aspect of the invention, the radio frequency amplifier includes: a transistor; an inductor connected to an input terminal of the transistor; a first resistor connected to the inductor; and a capacitor having one end connected to the first resistor and an other end grounded.

According to another aspect of the invention, a radio frequency amplifier includes: a transistor; a microstrip line connected to an input terminal of the transistor; a first resistor connected to the microstrip line; and a capacitor having one end connected to the first resistor and an other end grounded.

According to still another aspect of the invention, a radio frequency amplifier includes: a transistor; an inductor connected to an input terminal of the transistor; a first resistor connected to the inductor; a second resistor connected between a power supply terminal and the input terminal of the transistor; and a capacitor and a third resistor connected to each other in parallel, each having one end connected to the first resistor and an other end grounded.

According to still another aspect of the invention, a radio frequency amplifier includes: a transistor; a microstrip line connected to an input terminal of the transistor; a first resistor connected to the microstrip line; a second resistor connected between a power supply terminal and the input terminal of the transistor; and a capacitor and a third resistor connected to each other in parallel, each having one end connected to the first resistor and an other end grounded.

As described above, in the RF amplifier according to the present invention, a bias voltage supplying circuit including an inductor or a microstrip line having a negligible impedance for a low frequency is connected to an input terminal of a transistor, for example, a gate terminal of an FET. A resistor (a first resistor) for preventing oscillation is connected to the inductor or the microstrip line. This resistor for preventing the oscillation preferably has a resistance value in the range of about 30 $\Omega$ to about 70 $\Omega$. With such a configuration, the oscillation at a low frequency is restrained. In addition, by setting impedance of the bias voltage supplying circuit for a high frequency, viewed from the input terminal of the transistor, so as to be sufficiently large as compared with an input impedance of the transistor, the RF power to be supplied to the transistor is prevented from being leaked, resulting in an increase in the output power.

With the above configuration, restraint of oscillation at a low frequency and improvement of an output power can be simultaneously realized.

Thus, the invention described herein makes possible the advantage of providing a radio frequency amplifier stably operating against load variation while restraining oscillation at a low frequency without deteriorating the operational characteristics.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described in detail by way of illustrative example. In particular, in the following examples, an RF amplifier of the present invention includes an FET, which has a gate terminal functioning as an input terminal for the FET, and a bias voltage supplying circuit connected to the gate terminal.

EXAMPLE 1

Figure 1:
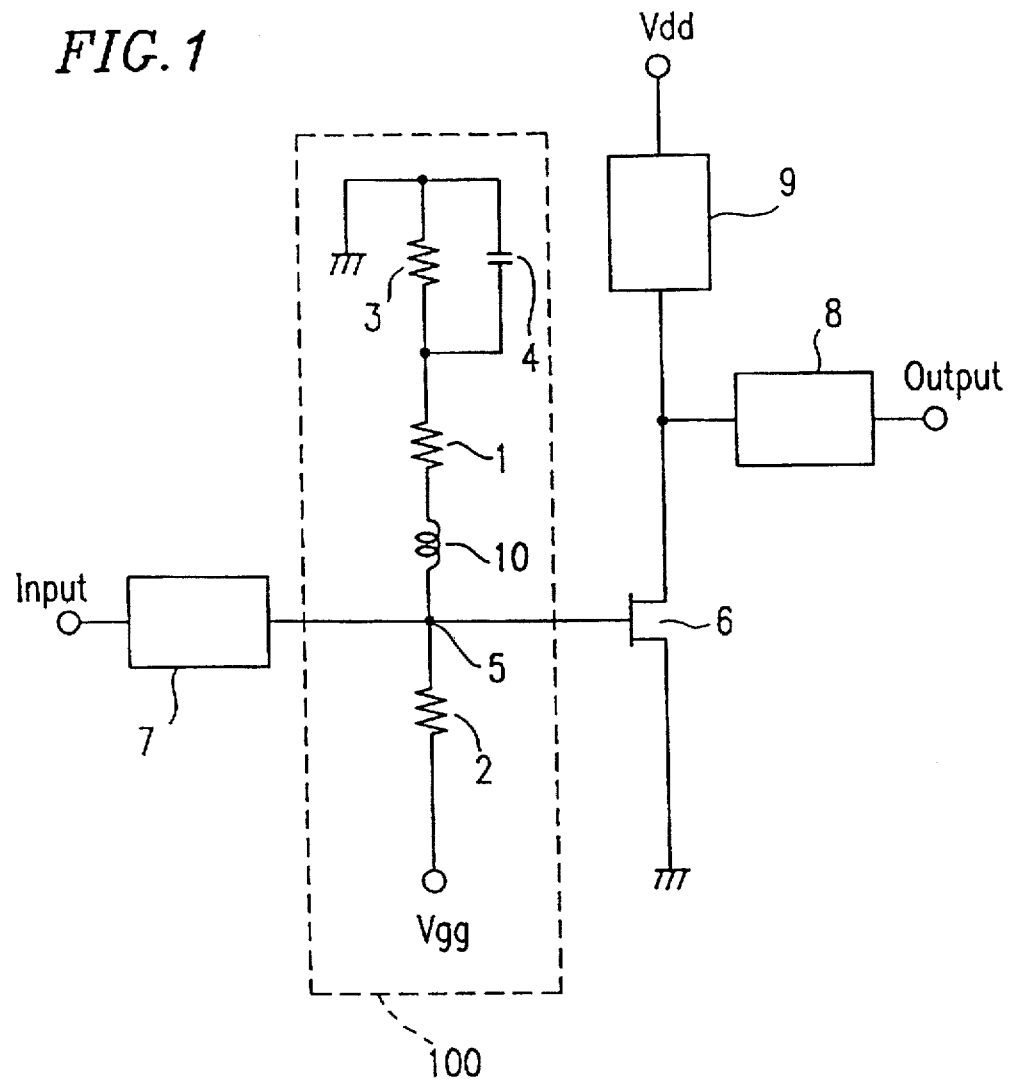
FIG. 1 is a schematic diagram showing the circuit configuration of an RF amplifier according to Example 1 of the present invention.

FIG. 1 is a schematic diagram showing the circuit configuration of an RF amplifier according to Example 1 of the present invention. In FIG. 1, a region corresponding to a gate bias voltage supplying circuit 100 is encircled by a dotted line.

In the circuit configuration shown in FIG. 1, an input impedance matching circuit 7 and a gate bias voltage supplying circuit 100 are connected between an input terminal of the RF amplifier and an FET 6. A drain terminal of the FET 6 is connected to a power supply terminal Vdd via a drain bias voltage supplying circuit 9 and to an output terminal of the RF amplifier via an output impedance matching circuit 8. A source terminal of the FET 6 is grounded.

The gate bias voltage supplying circuit 100 includes a resistor 2 connected between a gate terminal 5 of the FET 6 and a gate power supply terminal Vgg. The gate bias voltage supplying circuit 100 also includes an inductor 10, a resistor 1 and a parallel circuit of a resistor 3 and a capacitor 4, connected between the gate terminal 5 of the FET 6 and the grounded terminal.

A first function of the gate bias voltage supplying circuit 100 is to control a voltage supplied to the gate terminal 5 of the FET 6 by varying resistance values of the respective resistors 1 to 3 to change a dividing ratio for a constant voltage supplied from the gate power supply terminal Vgg (substantially, the dividing ratio is determined based on values of the resistors 2 and 3). A circuit 100 is to restrain oscillation at a low frequency by a series circuit of the inductor 10, the resistor 1 and the capacitor 4 included therein. The resistance values of the resistors 2 and 3 are set to be large values in the range of about several hundreds of $\Omega$ to about several k$\Omega$, so that the gate bias voltage supplying circuit 100 is prevented from adversely affecting the input impedance matching and a gate current is limited to about several mA.

In the gate bias voltage supplying circuit 100, it is assumed that the resistance values of the resistors 1 to 3 are r, R2 and R3, an inductance value of the inductor 10 is L and a capacitance value of the capacitor 4 is about 100 pF. When R3>>r, by using the inductance value L of the inductor 10 and the resistance value r of the resistor 1, and impedance Z for an RF signal, when the inductor 10 is viewed from the gate terminal 5 of the FET 6, can be approximated as: Z=r+j$\omega$L. For example, the impedance Z at a fundamental frequency f=about 1.5 GHz is obtained as: Z=50+j100 $\Omega$, where L=about 10 nH and r=about 50 $\Omega$. An absolute value |Z| is about 112 $\Omega$.

An input impedance of the high power FET 6 for the fundamental frequency f=about 1.5 GHz is typically about 5 $\Omega$. The aforementioned obtained absolute value of the impedance Z is considerably greater than this typical input impedance value of the FET 6. Accordingly, it is possible to prevent RF power to be input to the gate terminal 5 of the FET 6 from being leaked to the grounded terminal via the resistor 1 and the capacitor 4.

On the other hand, at low frequencies such as at f=about 20 MHz, impedance ωL of the inductor 10 is negligible and thus the impedance Z can be approximated as Z=about 50 Ω. This impedance value is extremely stable against abnormal oscillation, and can prevent oscillation at a low frequency. More specifically, while varying the resistance value r of the resistor 1, the most stable operation is obtained against load variation at an output terminal in the case where r is set to be about 50 Ω. In that case, the oscillation is not observed at a low frequency even if the load variation of VSWR≦10 occurs at the output terminal. Furthermore, by setting the resistance value r of the resistor 1 in the range of about 30 Ω to about 70 Ω, sufficient effect in restraining the oscillation at a low frequency is obtained. In such a case, the stable operation can be maintained even when the load variation of VSWR≦5 occurs at the output terminal.

Figure 2:
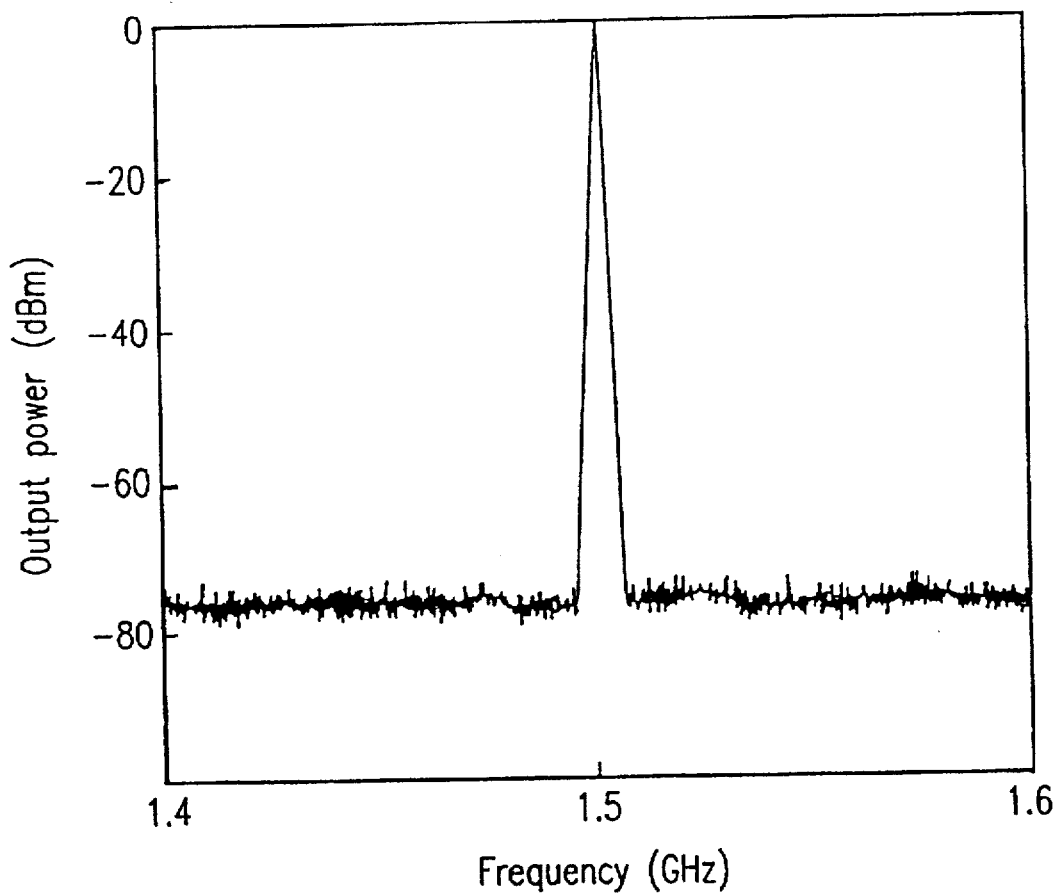
FIG. 2 is a graph showing an output power spectrum in the RF amplifier shown in FIG. 1 (in the case where a resistance value of a resistor for preventing oscillation included in a gate bias voltage supplying circuit is about 50 $\Omega$).

FIG. 2 is a graph showing an output power spectrum of the RF power amplifier shown in FIG. 1 in the case where the resistance value r of the resistor 1 is about 50 Ω and the inductance value L of the inductor 10 is about 10 nH.

In this case, even if the load variation of VSWR≦10 occurs at the output terminal, the oscillation at a low frequency is not observed. As an RF characteristic, an output power of about 31.5 dBm is obtained under the following conditions: a fundamental frequency of about 1.5 GHz; a power supply voltage of about 3.5 V; and input power of about 7 dBm; and an output load impedance of about 50 Ω. Even when the inductance value L of the inductor 10 is further increased, the output power greater than about 31.5 dBm cannot be obtained. Thus, the RF power is sufficiently prevented from being leaked by the inductor 10 having the inductance value of about 10 nH.

As described above, the gate bias voltage supplying circuit 100 shown in FIG. 1 is effective in preventing the RF power from being leaked and restraining oscillation at a low frequency.

Figure 3:
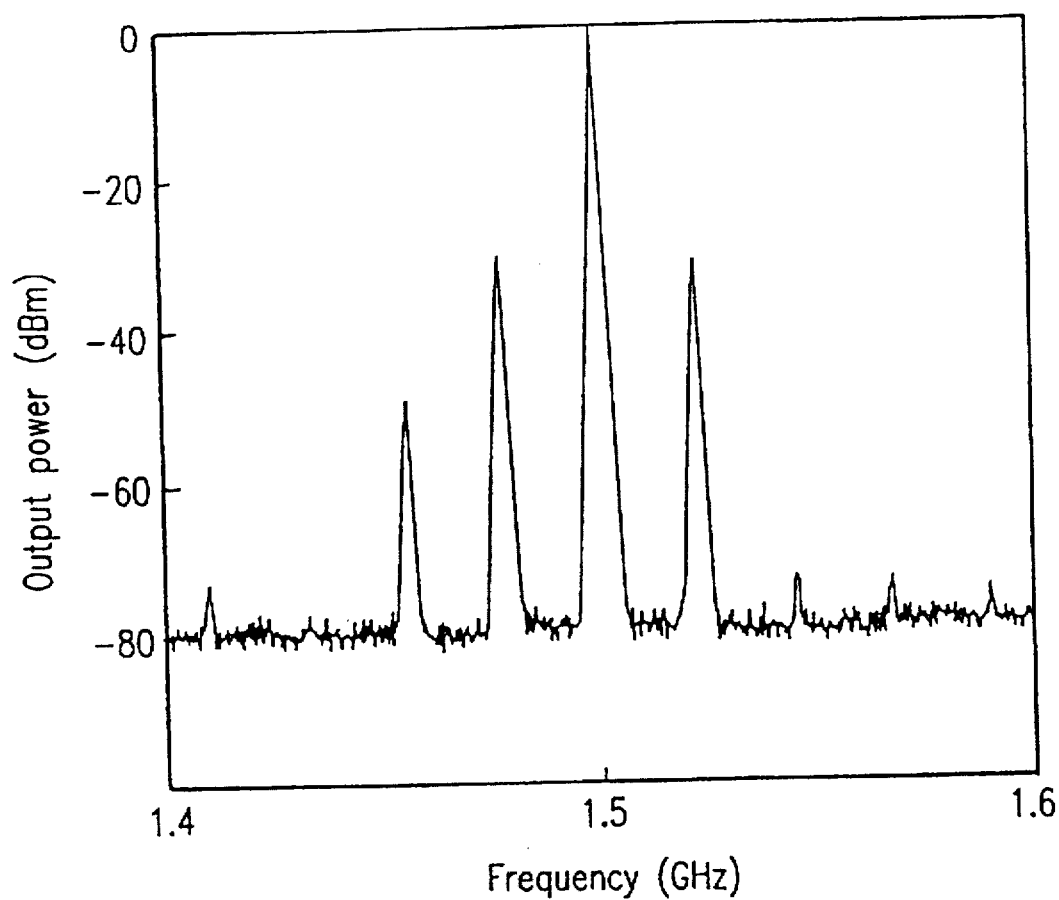
FIG. 3 is a graph showing an output power spectrum in the RF amplifier shown in FIG. 1 (in the case where a resistance value of the resistor for preventing oscillation included in the gate bias voltage supplying circuit is about 10 $\Omega$).

FIG. 3 is a graph showing an output power spectrum of the RF power amplifier shown in FIG. 1 in the case where the resistance value r of the resistor 1 is about 10 Ω and the inductance value L of the inductor 10 is about 10 nH.

In this case, the resistance value r of the resistor 1 is set to be smaller than that of FIG. 2. As a result, the oscillation occurs at a low frequency for load variation of VSWR≦5 at the output terminal. As an RF characteristic, an output power of about 31.5 dBm is obtained under the conditions: a fundamental frequency of about 1.5 GHz; a power supply voltage of about 3.5 V; input power of about 7 dBm; and an output load impedance of about 50 Ω.

As described above, in the gate bias voltage supplying circuit 100 shown in FIG. 1, by setting the inductance value L of the inductor 10 to be about 10 nH, the RF power is prevented from being leaked. With the resistance value r of the resistor 1 set to be about 10 Ω, however, the operation becomes unstable against oscillation as compared with the case where the resistance value r is set to be about 50 Ω.

Figure 4:
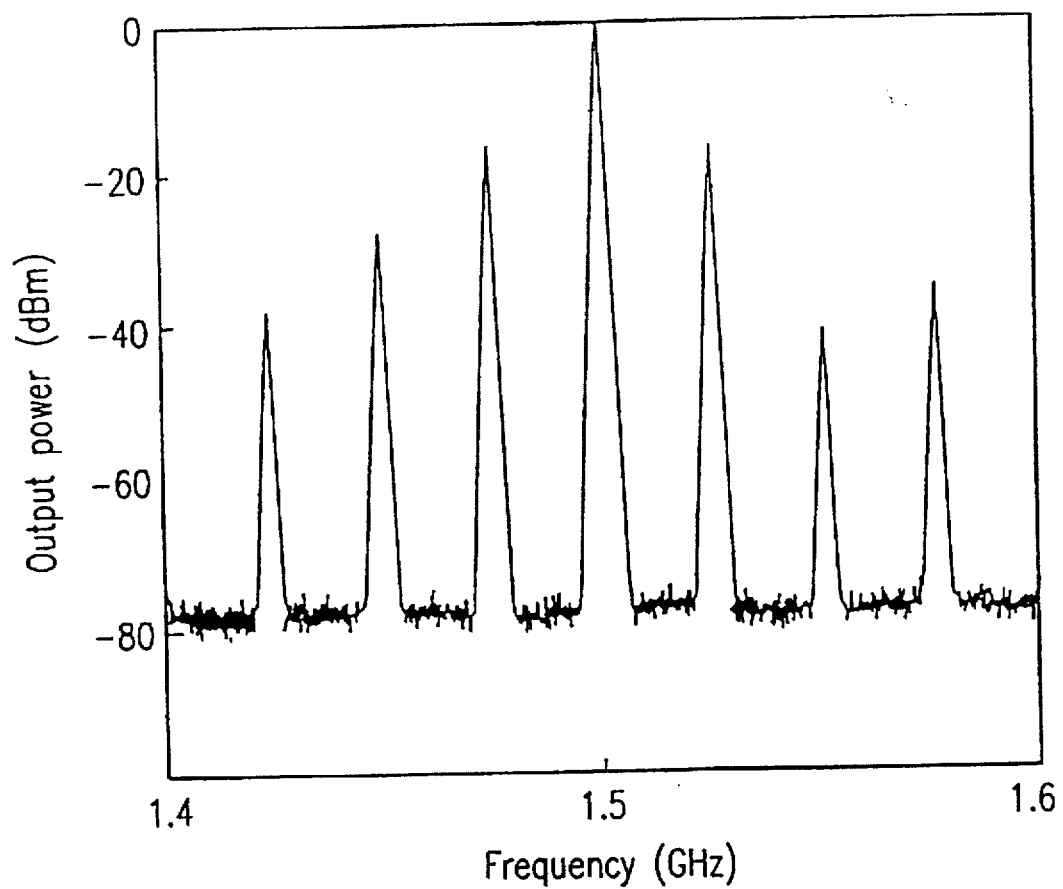
FIG. 4 is a graph showing an output power spectrum in the RF amplifier shown in FIG. 1 (in the case where a resistance value of the resistor for preventing oscillation included in the gate bias voltage supplying circuit is about 160 $\Omega$).

FIG 4 is a graph showing an output power spectrum of the RF power amplifier shown in FIG. 1 in the case where the resistance value r of the resistor 1 is about 150 Ω and the inductance value L of the inductor 10 is about 10 nH.

In this case, the oscillation occurs at a low frequency for load variation of VSWR≦5 at the output terminal. As an RF characteristic, output power of about 31.5 dBm is obtained with a fundamental frequency of about 1.5 GHz, a power supply voltage of about 3.5 V, input power of about 7 dBm and an output load impedance of about 50 Ω. As described above, in the case where the resistance value r of the resistor 1 is too large, oscillation also occurs at a low frequency due to load variation of VSWR≦5 at the output terminal. As a result, the operation of the RF amplifier becomes unstable to oscillation.

Figure 5:
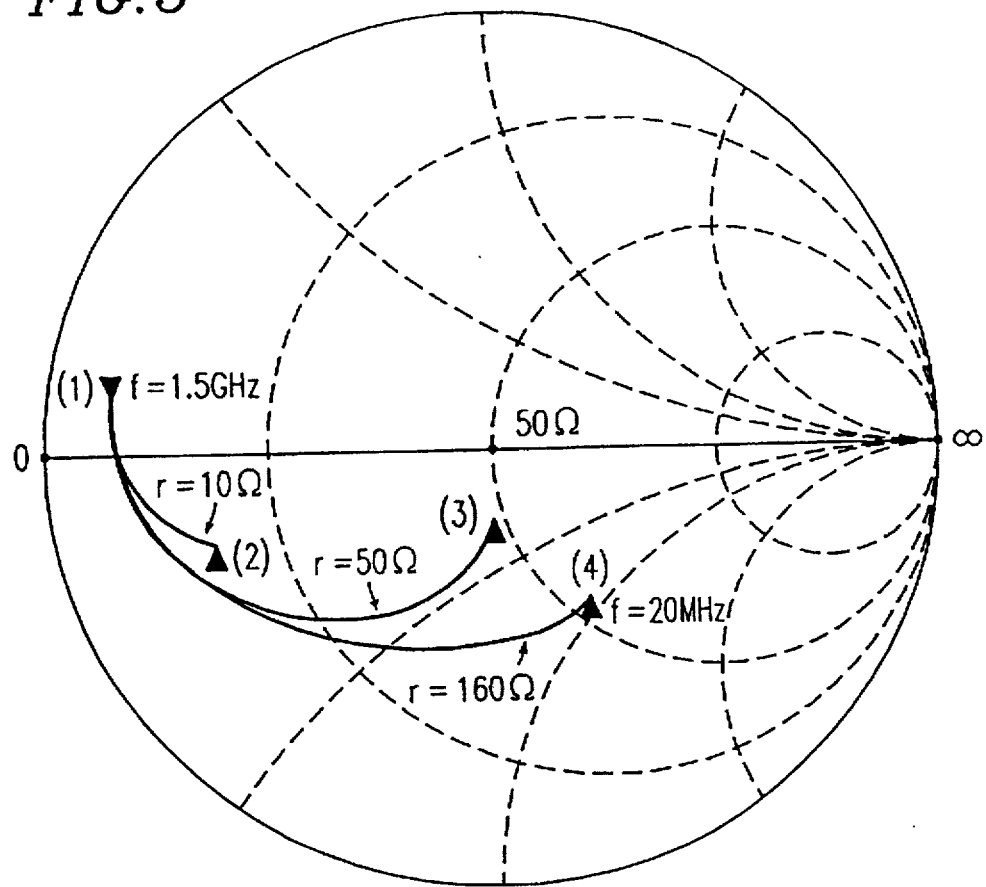
FIG. 5 is a Smith chart showing impedances in the RF power amplifier shown in FIG. 1 when an input side is viewed from a gate terminal of an FET.

The reason why oscillation is prevented from occurring at a low frequency in the gate bias voltage supplying circuit 100 by setting the resistance value r of the resistor 1 in the vicinity of 50 Ω will be described with reference to FIG. 5. FIG. 5 is a Smith chart showing impedance of the input impedance matching circuit 7 including the gate bias voltage supplying circuit 100 when being viewed from the gate terminal 5 of the FET 6.

An impedance value at an operating frequency of f=about 1.5 GHz (see a point (1) in FIG. 5) matches with the input impedance of the high power FET 6, i.e., about 5 Ω. Even in the case where the resistance value r of the resistor 1 is varied in the range of about 10 Ω to about 160 Ω, the impedance value at the operating frequency f=about 1.5 GHz remains unshifted (the point (1) in FIG. 5).

On the other hand, an impedance value at a low frequency f=about 20 MHz greatly varies depending on the resistance value r of the resistor 1. More specifically, in the case where the resistance value r of the resistor 1 is about 160 Ω, the impedance value at a low frequency of about 20 MHz is peripherally located on the Smith chart as indicated with a point (4) in FIG. 5, and VSWR is about 2.5. In the case where the resistance value r of the resistor 1 is about 50 Ω, the impedance value at the frequency of about 20 MHz approaches 50 Ω as indicated with a point (3) in FIG. 5, and VSWR is improved to be about 1.4. Furthermore, in the case where the resistance value r of the resistor 1 is about 10 Ω, the impedance value at a frequency of about 20 MHz becomes smaller than 50 Ω as indicated with a point (2) in FIG. 5, and VSWR becomes about 4.7.

As is understood from the above results, the reason why the operation of the gate bias voltage supplying circuit 100 becomes the most stable against oscillation at a low frequency when the resistance value r of the resistor 1 is about 50 Ω is because the impedance value at a low frequency (for example, f=about 20 MHz) becomes the closest to 50 Ω with this resistance value.

TABLE 1

| Inductance L of inductor 10 [nH] | Resistance value r of resistor 1 [Ω] | Output power [dBm] | Oscillation | Total characterstic |
|---|---|---|---|---|
| 10 | 160 | 31.5 | X | X |
| 10 | 100 | 31.5 | X | X |
| 10 | 70 | 31.5 | O | O |
| 10 | 50 | 31.5 | O | O |
| 10 | 30 | 31.5 | O | O |
| 10 | 10 | 31.5 | X | X |

Table 1 shows changes in output power and indicates whether or not oscillation occurs (O corresponds to the case where no oscillation occurs, and X corresponds to the case where oscillation occurs) in accordance with variation in the resistance value r of the resistor 1, in the case where the gate bias voltage supplying circuit 100 according to Example 1 is applied to a two-stage power amplifier of an output class of 1 W. The measurement conditions of the output power, that is, a fundamental frequency f=about 1.5 GHz, a power supply voltage Vdd=about 3.5 V and input power Pin=7 dBm are set constant for each of the resistance values r. In the measurement of the occurrence of oscillation at a low frequency, the load at an output terminal is varied in the range of VSWR≦5.

As shown in Table 1, even when the resistance value r of the resistor 1 is varied, the obtained output power remains substantially constant. In order to restrain oscillation at a low frequency against the load variation, however, it is necessary to set the resistance value r of the resistor 1 in the range of about 30 Ω to about 70 Ω.

Table 2 shows variation in the output power in the case where the inductance L of the inductor 10 is varied while keeping the resistance value r of the resistor 1 to be about 50 Ω so as to restrain oscillation. The measurement conditions of the output power, that is, a fundamental frequency f=about 1.5 GHz, a power supply voltage Vdd=about 3.5 V and input power Pin=7 dBm are set constant for each of the inductance values L. In the measurement of the occurrence of oscillation at a low frequency, the load at an output terminal is varied in the range of VSWR≦5.

When the gate bias voltage supplying circuit 100 does not include the inductor 10 (L=0 nH), the output power is about 30.7 dBm. The output power is improved by increasing the inductance L, and is almost saturated at L>5 nH. This is because the impedance (Z=r+jωL) viewed from the gate terminal 5 of the FET 6 becomes sufficiently large as compared with the input impedance of the FET 6 by increasing the inductance L of the inductor 10, resulting in preventing leakage of the RF power.

TABLE 2

| Inductance L of inductor 10 [nH] | ωL [Ω] | Resistance value r of resistor 1 [Ω] | Output power [dBm] | Oscillation | Total characteristic |
|---|---|---|---|---|---|
| 0 | 0 | 50 | 30.7 | O | X |
| 1 | 10 | 50 | 30.9 | O | O |
| 2 | 20 | 50 | 31.2 | O | O |
| 5 | 50 | 50 | 31.4 | O | O |
| 10 | 100 | 50 | 31.5 | O | O |

As described above, in the gate bias voltage supplying circuit 100, the inductor 10 having a negligibly small impedance value for a low frequency is provided between the gate terminal 5 of the FET 6 and the resistor 1, while setting the resistance value r of the resistor 1 in the range of about 30 Ω to about 70 Ω. As a result, the restraint of the oscillation at a low frequency and the improvement of the output power are simultaneously realized. More specifically, it is preferable that the inductance L of the inductor 10 is set in the range of about 10 Ω≦2πfL≦about 100 Ω for an operating frequency f.

EXAMPLE 2

Figure 6:
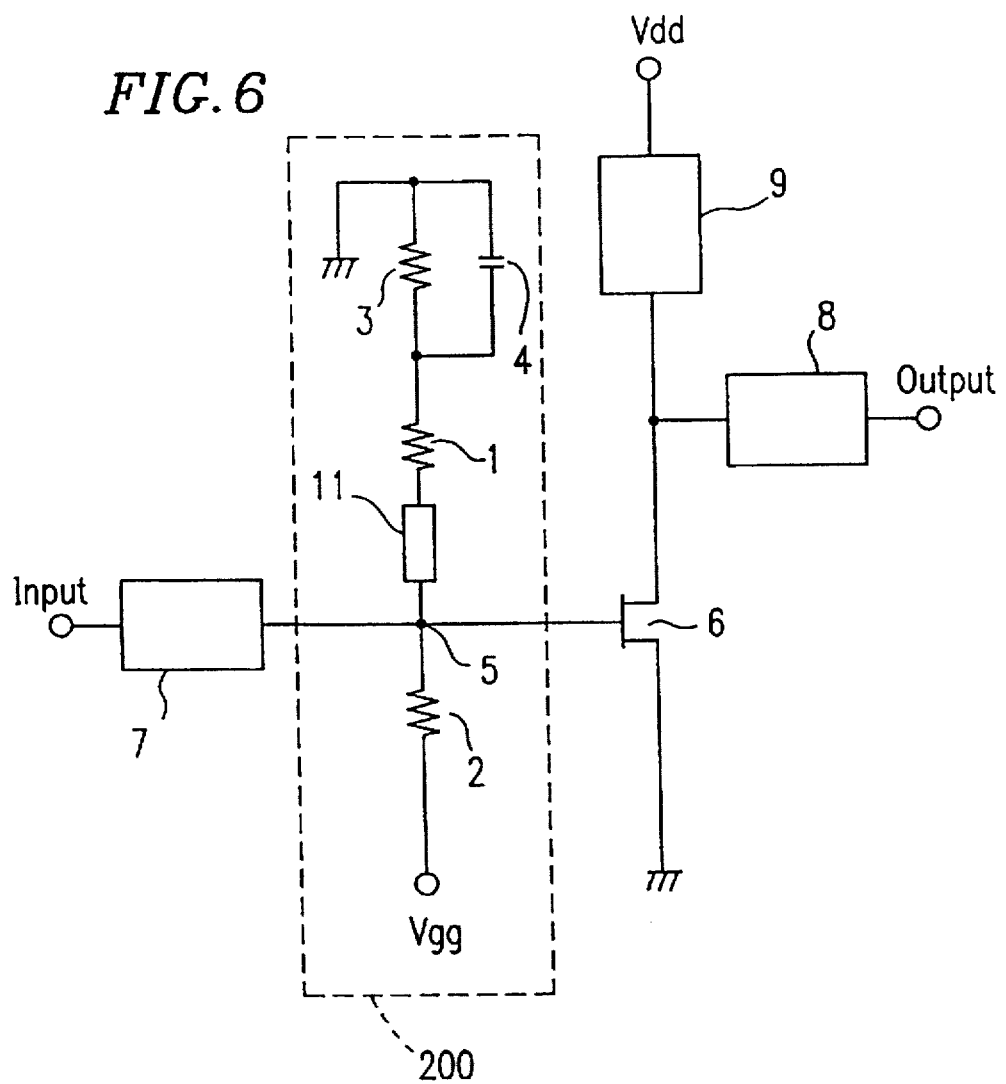
FIG. 6 is a schematic diagram showing the circuit configuration of an RF amplifier according to Example 2 of the present invention.

FIG. 6 is a schematic view showing the circuit configuration of an RF amplifier according to Example 2 of the present invention. In FIG. 6, a gate bias voltage supplying circuit 200 is encircled by a dotted line.

In the gate bias voltage supplying circuit 200 shown in FIG. 6, the inductor 10 included in the gate bias voltage supplying circuit 100 of Example 1 in FIG. 1 is replaced with a microstrip line 11. The other components are the same as those in FIG. 1 of Example 1, and are denoted by the same reference numerals. Therefore, the description thereof is herein omitted.

In the configuration of the gate bias voltage supplying circuit 200 shown in FIG. 6, the oscillation at a low frequency can be restrained by setting the resistance value r of the resistor 1 in the range of about 30 Ω to about 70 Ω.

In the case where the resistance value r of the resistor 1 is about 50 Ω, an impedance when the microstrip line 11 is viewed from the gate terminal 5 of the FET 6 significantly varies depending on whether a characteristic impedance $Z_0$ of the microstrip line 11 is greater than about 50 Ω or not. More specifically, when the microstrip line 11 is prolonged, the impedance shifts to a higher impedance side, where the characteristic impedance $Z_0$ satisfies $Z_0$>50 Ω. On the other hand, when the characteristic impedance $Z_0$<50 Ω, the impedance shifts to a lower impedance side by prolonging the microstrip line 11. Accordingly, in order to prevent leakage of the RF power to be input to the gate terminal 5 of the FET 6 by inserting the microstrip line 11, it is necessary that the characteristic impedance $Z_0$ of the microstrip line 11 is set to satisfy $Z_0$>50 Ω.

For example, in the case where the microstrip line 11 is formed using a substrate having a thickness of about 0.6 mm and a relative dielectric constant $\epsilon_r$ of about 10.5, a characteristic impedance of about 80 Ω or greater is obtained with a line width of about 0.1 mm. Therefore, the RF power can be prevented from being leaked via the resistor 1.

The change in output power with respect to the variation in a length d of the microstrip line 11 will be shown in Table 3. The measurement conditions of the output power, that is, a fundamental frequency f=about 1.5 GHz, a power supply voltage Vdd=about 3.5 V and input power Pin=7 dBm are set constant for each of the length d. In the measurement of the occurrence of oscillation at a low frequency, the load at an output terminal is varied in the range of VSWR≦5.

TABLE 3

| Length d of microstrip line 11 | | Resistance value r of the resistor 1 [Ω] | Output power [dBm] | Oscillation | Total characteristics |
|---|---|---|---|---|---|
| [mm] | Electrical length | | | | |
| 0 | 0 | 50 | 30.7 | O | X |
| 2 | λ/40 | 50 | 31.0 | O | Δ |
| 5 | λ/16 | 50 | 31.3 | O | O |
| 10 | λ/8 | 50 | 31.5 | O | O |

In the case where the microstrip line 11 is not used (i.e., in the case where a length of the micro strip line 11 is 0), the output power is about 30.7 dBm. The output power is improved by increasing the length of the microstrip line 11, and is almost saturated at d>10 mm (λ/8 in terms of the electrical length). This is because the impedance (Z=r+jωL) of the gate bias voltage supplying circuit 200 viewed from the gate terminal 5 of the FET 6 becomes sufficiently large as compared with the input impedance of the FET 6, resulting in preventing leakage of high frequency power.

As described above, in the gate bias voltage supplying circuit 200, the microstrip line 11 having a negligible impedance value for a low frequency is provided between the gate terminal 5 of the FET 6 and the resistor 1 while setting the resistance value r of the resistor 1 in the range of about 30 Ω to about 70 Ω. As a result, the restraint of oscillation at a low frequency and the improvement of the output power are simultaneously realized. More specifically, it is preferable that the characteristic impedance of the microstrip line 11 is set so as to be greater than the resistance value r of the resistor 1 and the length d of the microstrip line 11 is set to be in the range of about λ/40≦d≦about λ/8.

EXAMPLE 3

Figure 7:
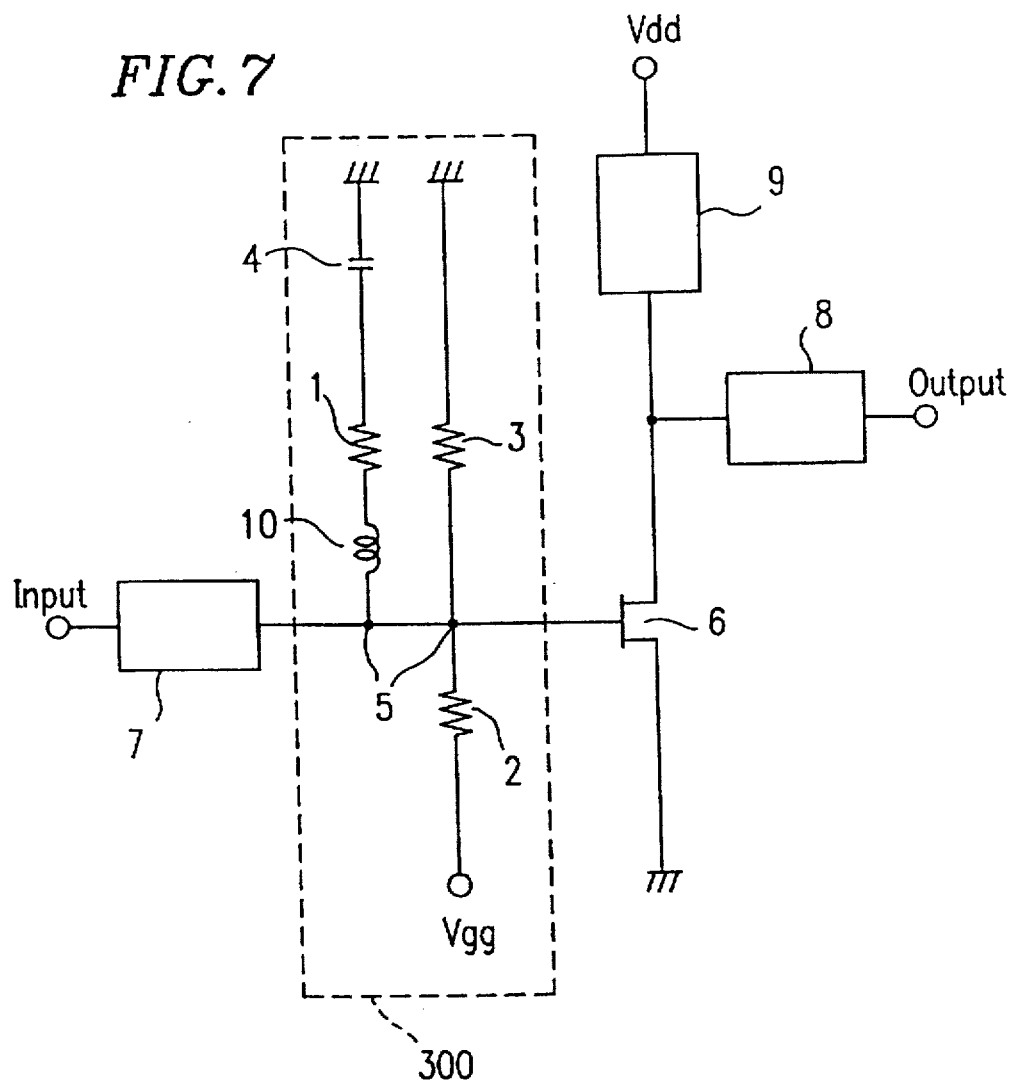
FIG. 7 is a schematic diagram showing the circuit configuration of an RF amplifier according to Example 3 of the present invention.

FIG. 7 is a schematic view showing the circuit configuration of an RF amplifier according to Example 3 of the present invention. In FIG. 7, a gate bias voltage supplying circuit 300 is encircled by a dotted line. The corresponding components as those in FIGS. 1 and 6 are denoted by the same reference numerals in FIG. 7.

In the circuit configuration of FIG. 7, the input impedance matching circuit 7 and a gate bias voltage supplying circuit 300 are connected between an input terminal of the RF amplifier and the FET 6. A drain terminal of the FET 6 is connected to the power supply terminal Vdd via the drain bias voltage supplying circuit 9 and to an output terminal of the RF amplifier via the output impedance matching circuit 8. A source terminal of the FET 6 is grounded.

The gate bias voltage supplying circuit 300 includes the resistor 2 connected between the gate terminal 5 of the FET 6 and the gate power supply terminal Vgg and the resistor 3 connected between the gate terminal 5 of the FET 6 and the grounded terminal. Furthermore, the gate bias voltage supplying circuit 300 includes, between the gate terminal 5 of the FET 6 and the grounded terminal, a series circuit of the inductor 10, the resistor 1 and the capacitor 4.

The first function of the gate bias voltage supplying circuit 300 is to control a voltage supplied to the gate terminal 5 of the FET 6 by varying the resistance values of the resistors 2 and 3 so as to change a dividing ratio for a constant voltage supplied from the gate power supply terminal Vgg. The second function of the gate bias voltage supplying circuit 300 is to restrain oscillation at a low frequency by the series circuit of the inductor 10, the resistor 1 and the capacitor 4 included therein. The resistance values of the resistors 2 and 3 are set to be large values, i.e., about several hundreds of $\Omega$ to about several k$\Omega$, so as to prevent the gate bias voltage supplying circuit 300 from adversely affecting input impedance matching and to limit a gate current to about several mA.

With such a configuration of the gate bias voltage supplying circuit 300, the similar results as shown in Tables 1 and 2 previously mentioned can be obtained. More specifically, by setting the resistance value r of the resistor 1 in the range of about 30 $\Omega$ to about 70 $\Omega$, oscillation at a low frequency can be restrained. Furthermore, by inserting the inductor 10 having a negligible impedance value for a low frequency between the gate terminal 5 of the FET 6 and the resistor 1, the RF power can be prevented from being leaked so as to increase the output power. The same effect can be obtained even when the connecting order of the inductor 10, the resistor 1 and the capacitor 4 is changed.

EXAMPLE 4

Figure 8:
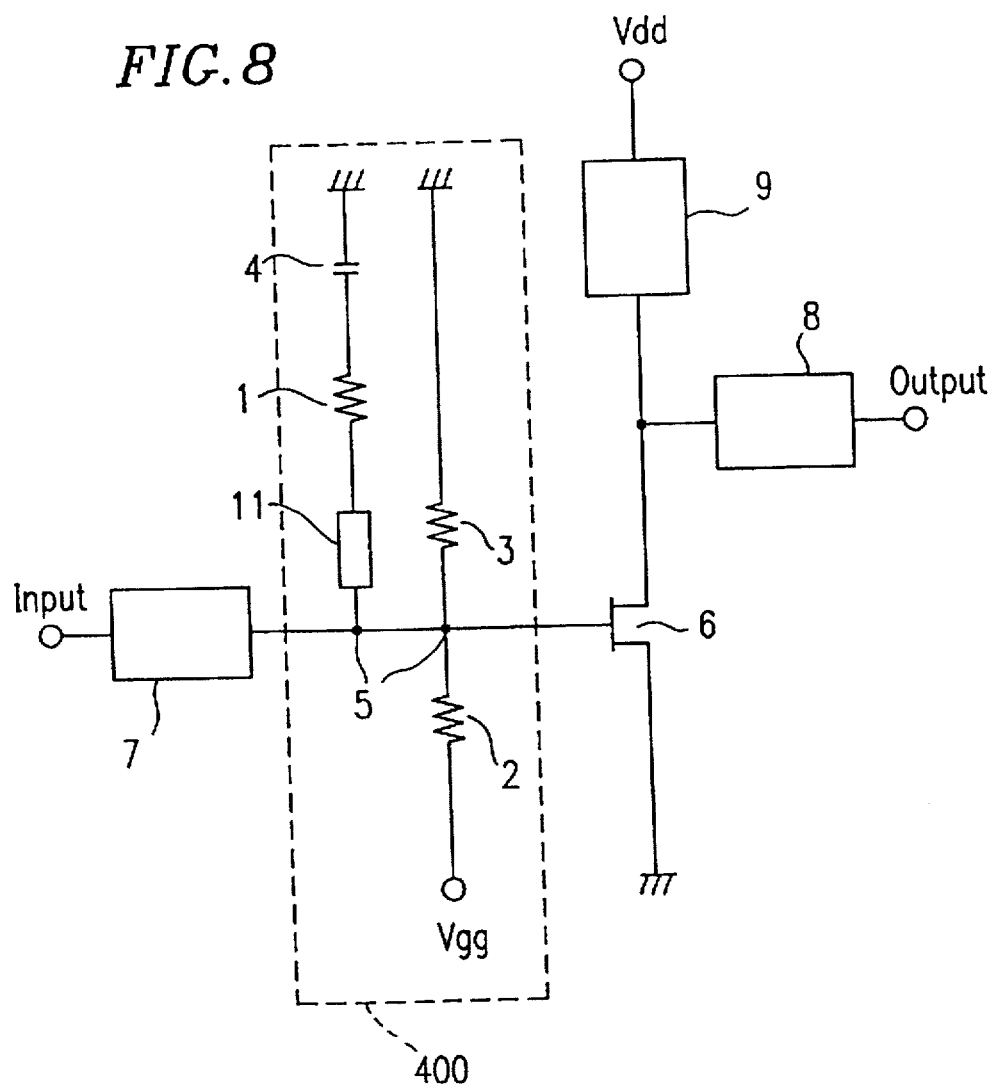
FIG. 8 is a schematic diagram showing the circuit configuration of an RF amplifier according to Example 4 of the present invention.
Figure 9A:
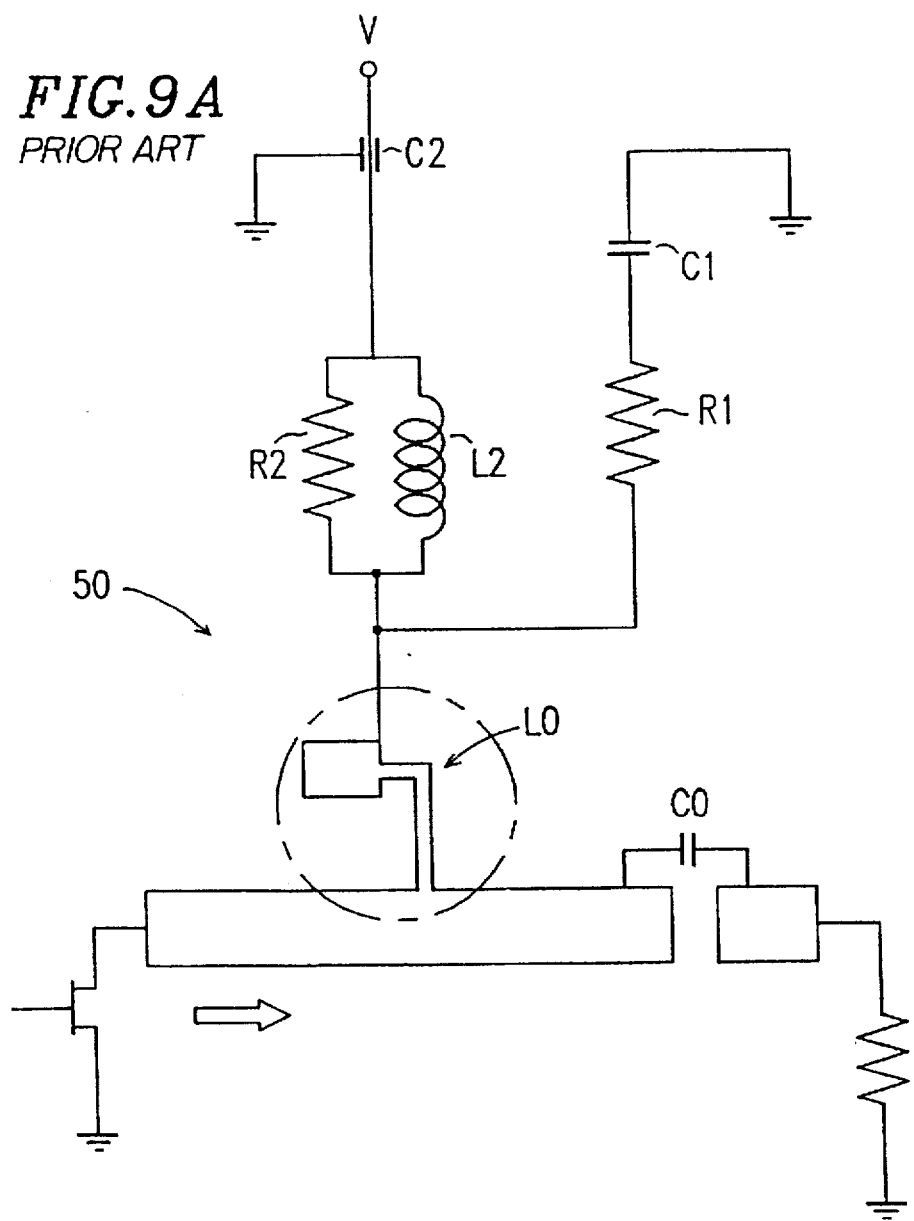
FIG. 9A is a schematic diagram showing the configuration of a bias voltage supplying circuit in a conventional RF power amplifier.
Figure 9B:
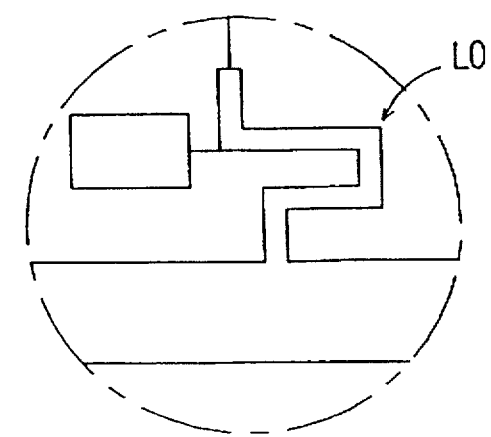
FIG. 9B is an enlarged view of the encircled portion of FIG. 9A.

FIG. 8 is a schematic view showing the circuit configuration of an RF amplifier according to Example 4 of the present invention. In FIG. 8, a gate bias voltage supplying circuit 400 is encircled by a dotted line.

In the gate bias voltage supplying circuit 400, the inductor 10 included in the gate bias voltage supplying circuit 300 in FIG. 7 according to Example 3 is replaced with the microstrip line 11. The other components are the same as those in FIG. 7, and are denoted by the same reference numerals. The description thereof is herein omitted.

In the configuration of the gate bias voltage supplying circuit 400 shown in FIG. 8, oscillation at a low frequency can also be restrained by setting the resistance value r of the resistor 1 in the range of about 30 $\Omega$ to about 70 $\Omega$.

Moreover, in such a configuration of the gate bias voltage supplying circuit 400, the same results as those shown in Table 3 can be obtained. More specifically, by setting the resistance value r of the resistor 1 in the range of about 30 $\Omega$ to about 70 $\Omega$, oscillation at a low frequency can be restrained. Furthermore, by inserting the microstrip line 11 having a negligible impedance value for a low frequency between the gate terminal 5 of the FET 6 and the resistor 1, the RF power can be prevented from being leaked so as to increase the output power. Even if the connecting order of the microstrip line 11, the resistor 1 and the capacitor 4 is changed, the similar effect can be obtained.

The configuration of the RF amplifier in each of the examples described above has sufficient stability against the variation in the load connected to the output terminal.

In the above explanations, the RF amplifiers of the present invention have a configuration in which a signal to be amplified is input to a gate terminal of an FET. It is appreciated, however, that the present invention can be applied to other configurations. For example, an input signal can be provided to a source terminal or a drain terminal of an FET. Alternatively, an input signal can be supplied to a base terminal of a bipolar transistor.

As described above, in the RF amplifiers according to the present invention, by setting a resistance value r of a resistor for preventing the oscillation included in a bias voltage supplying circuit to be in the range of about 30 $\Omega$ to about 70 $\Omega$, oscillation at a low frequency can be restrained.

Furthermore, the bias voltage supplying circuit includes an inductor or a microstrip line having a negligible impedance value for a low frequency which is inserted between an input terminal of a transistor, such as a gate terminal of an FET, and the resistor. By setting an impedance of the bias voltage supplying circuit for a high frequency, which is viewed from the input terminal of the transistor, to be sufficiently greater than an input impedance of the transistor, the RF power to be supplied to the transistor can be prevented from being leaked, thereby increasing the output power.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A radio frequency amplifier comprising:
   a transistor;
   an inductor connected to an input terminal of the transistor;
   a first resistor connected to the inductor;
   a capacitor having one end connected to the first resistor and an other end grounded; and
   a second resistor connected between a power supply terminal and the input terminal of the transistor.

2. A radio frequency amplifier comprising:
   a transistor;
   a microstrip line connected to an input terminal of the transistor;
   a first resistor connected to the microstrip line;
   a capacitor having one end connected to the first resistor and an other end grounded; and
   a second resistor connected between a power supply terminal and the input terminal of the transistor.

3. A radio frequency amplifier comprising:
   a transistor;
   an inductor connected to an input terminal of the transistor;

a first resistor connected to the inductor;

a second resistor connected between a power supply terminal and the input terminal of the transistor; and a capacitor and a third resistor connected to each other in parallel, each having one end connected to the first resistor and an other end grounded.

4. A radio frequency amplifier comprising:

a transistor;

a microstrip line connected to an input terminal of the transistor;

a first resistor connected to the microstrip line;

a second resistor connected between a power supply terminal and the input terminal of the transistor; and a capacitor and a third resistor connected to each other in parallel, each having one end connected to the first resistor and an other end grounded.

5. A radio frequency amplifier according to claim 1, wherein a resistance value of the first resistor is in a range of about 30 Ω to about 70 Ω.

6. A radio frequency amplifier according to claim 2, wherein a resistance value of the first resistor is in a range of about 30 Ω to about 70 Ω.

7. A radio frequency amplifier according to claim 3, wherein a resistance value of the first resistor is in a range of about 30 Ω to about 70 Ω.

8. A radio frequency amplifier according to claim 4, wherein a resistance value of the first resistor is in a range of about 30 Ω to about 70 Ω.

9. A radio frequency amplifier according to claim 1, wherein an inductance value of the inductor is such that an impedance value for a low frequency becomes negligibly small.

10. A radio frequency amplifier according to claim 3, wherein an inductance value of the inductor is such that an impedance value for a low frequency becomes negligibly small.

11. A radio frequency amplifier according to claim 2, wherein a length of the microstrip line is such that an impedance value for a low frequency becomes negligibly small.

12. A radio frequency amplifier according to claim 4, wherein a length of the microstrip line is such that an impedance value for a low frequency becomes negligibly small.

13. A radio frequency amplifier according to claim 1, wherein an inductance value L of the inductor is set so as to satisfy a relation: about $10\ \Omega \leq 2\pi fL \leq$ about $100\ \Omega$ for an operating frequency f.

14. A radio frequency amplifier according to claim 3, wherein an inductance value L of the inductor is set so as to satisfy a relation: about $10\ \Omega \leq 2\pi fL \leq$ about $100\ \Omega$ for an operating frequency f.

15. A radio frequency amplifier according to claim 2, wherein a characteristic impedance of the microstrip line is set so as to be higher than a resistance value of the first resistor, and a length d of the microstrip line is set so as to satisfy a relation: $\lambda/40 \leq d \leq \lambda/8$ for a wavelength $\lambda$ of an operating frequency.

16. A radio frequency amplifier according to claim 4, wherein a characteristic impedance of the microstrip line is set so as to be higher than a resistance value of the first resistor, and a length d of the microstrip line is set so as to satisfy a relation: $\lambda/40 \leq d \leq \lambda/8$ for a wavelength $\lambda$ of an operating frequency.

17. A radio frequency amplifier according to claim 1, wherein the radio frequency amplifier is used in a microwave frequency band in a range of about 1 GHz to about 2 GHz, and an output power of the transistor is in a range of several hundreds of mW to several W.

18. A radio frequency amplifier according to claim 2, wherein the radio frequency amplifier is used in a microwave frequency band in a range of about 1 GHz to about 2 GHz, and an output power of the transistor is in a range of several hundreds of mW to several W.

19. A radio frequency amplifier according to claim 3, wherein the radio frequency amplifier is used in a microwave frequency band in a range of about 1 GHz to about 2 GHz, and an output power of the transistor is in a range of several hundreds of mW to several W.

20. A radio frequency amplifier according to claim 4, wherein the radio frequency amplifier is used in a microwave frequency band in a range of about 1 GHz to about 2 GHz, and an output power of the transistor is in a range of several hundreds of mW to several W.

21. A radio frequency amplifier according to claim 1, further comprising a third resistor having one end connected to the input terminal of the transistor and an other end grounded.

22. A radio frequency amplifier according to claim 2, further comprising a third resistor having one end connected to the input terminal of the transistor and an other end grounded.

* * * * *